(12) United States Patent
Wang et al.

(10) Patent No.: US 12,100,135 B2
(45) Date of Patent: Sep. 24, 2024

(54) METHOD AND SYSTEM FOR OVERLAY ERROR COMPENSATION AND COMPUTER-READABLE STORAGE MEDIUM

(71) Applicant: CHANGXIN MEMORY TECHNOLOGIES, INC., Hefei (CN)

(72) Inventors: Shun Wang, Hefei (CN); Junjun Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 368 days.

(21) Appl. No.: 17/726,710

(22) Filed: Apr. 22, 2022

(65) Prior Publication Data
US 2023/0177675 A1    Jun. 8, 2023

(30) Foreign Application Priority Data
Dec. 6, 2021    (CN) .......................... 202111511510.1

(51) Int. Cl.
*G03F 7/00* (2006.01)
*G06T 7/00* (2017.01)

(52) U.S. Cl.
CPC .......... *G06T 7/001* (2013.01); *G03F 7/70633* (2013.01); *G06T 2207/10061* (2013.01); *G06T 2207/30148* (2013.01)

(58) Field of Classification Search
CPC .......... G06T 7/001; G06T 2207/10061; G06T 2207/30148; G03F 7/70633; G03F 7/706837; G03F 9/7088

USPC .......................................................... 382/151
See application file for complete search history.

(56) References Cited

U.S. PATENT DOCUMENTS

| | | | |
|---|---|---|---|
| 7,508,976 B1* | 3/2009 | Yang .................. | G03F 7/70633 382/151 |
| 2004/0101983 A1* | 5/2004 | Jones ...................... | H01L 22/20 257/E21.525 |
| 2019/0072848 A1* | 3/2019 | Guo .................... | G03F 7/70633 |

FOREIGN PATENT DOCUMENTS

| | | |
|---|---|---|
| CN | 109426692 A | 3/2019 |
| CN | 108089412 B | 10/2020 |

* cited by examiner

*Primary Examiner* — Huy C Ho
(74) *Attorney, Agent, or Firm* — Kilpatrick Townsend & Stockton LLP

(57) ABSTRACT

Disclosed are a method and system for overlay error compensation and a storage medium. The method includes that N wafer groups are provided, wherein each wafer group includes M wafers each including a present and previous layer, and N and M are positive integers greater than or equal to 2; for each wafer, a first overlay error is determined according to device structures of the present and previous layers, and a photoetching compensation value is calculated according to the first overlay error; for each wafer group, a first average compensation value is calculated according to photoetching compensation values; a second average compensation value of the N wafer groups is calculated according to first average compensation values; and in response to that the second average compensation value is within a preset range, the second average compensation value is fed to a batch control system to compensate an $(N+1)^{th}$ wafer group.

20 Claims, 5 Drawing Sheets

METHOD AND SYSTEM FOR OVERLAY ERROR COMPENSATION AND COMPUTER-READABLE STORAGE MEDIUM

CROSS-REFERENCE TO RELATED APPLICATION

This application claims priority to Chinese patent application No. 202111511510.1, filed on Dec. 6, 2021, the disclosure of which is hereby incorporated by reference in its entirety.

BACKGROUND

A key parameter representing the integrated circuit manufacturing technology is smallest feature size, that is, Critical Dimension (CD). With the reduction of the CD, even to a nanometer level, it is possible to arrange millions of devices on each chip.

In the manufacturing process of semiconductor devices, it is usually necessary to form layered structures of stacked upper and lower layers, and to form various elements in corresponding layers. In the layered structures of upper and lower layers, a present layer needs to be aligned to a previous layer, so that a certain element formed in the present layer vertically corresponds to a certain element of the previous layer or is vertically connected thereto, etc. Therefore, the overlay between an upper layer and a lower layer becomes an important factor affecting the device performance.

However, the overlay compensation method in the related art cannot improve the overlay accuracy well, affecting the product yield.

SUMMARY

Embodiments of the disclosure relates to the technical field of semiconductors, in particular to a method and system for overlay error compensation and a computer-readable storage medium.

The method for overlay error compensation of the embodiments of the disclosure may include the following operations. N wafer groups are provided. Each wafer group of the N wafer groups includes M wafers, each wafer of the M wafers includes a present layer and a previous layer, and both N and M are positive integers greater than or equal to 2. For each wafer, a respective first overlay error is determined according to device structures of the respective present layer and the respective previous layer, and a respective photoetching compensation value is calculated according to the respective first overlay error. For each wafer group, a respective first average compensation value is calculated according to photoetching compensation values of wafers in the wafer group. A second average compensation value of the N wafer groups is calculated according to first average compensation values of the N wafer groups. In response to that the second average compensation value is within a preset range, the second average compensation value is fed to a batch control system to compensate a $(N+1)^{th}$ wafer group.

The system for overlay error compensation of the embodiments of the disclosure may include: N wafer groups, wherein each wafer group of the N wafer groups comprises M wafers, each wafer of the M wafers comprises a respective present layer and a respective previous layer, and both N and M are positive integers greater than or equal to 2; a first measurement unit, configured to: for each wafer, determine a respective first overlay error according to device structures of the respective present layer and the respective previous layer; a first calculation unit, configured to: calculate, for each wafer, a respective photoetching compensation value according to the respective first overlay error, calculate, for each wafer group, a respective first average compensation value according to photoetching compensation values of wafers in the wafer group, and calculate a second average compensation value of the N wafer groups according to first average compensation values of the N wafer groups; and a batch control system, configured to compensate a $(N+1)^{th}$ wafer group in response to that the second average compensation value is within a preset range.

The embodiments of the disclosure provide a computer-readable storage medium having stored thereon a computer program that, when executed by a processor, causes the processor to implement the steps of any above method.

DETAILED DESCRIPTION

Figure 1A:
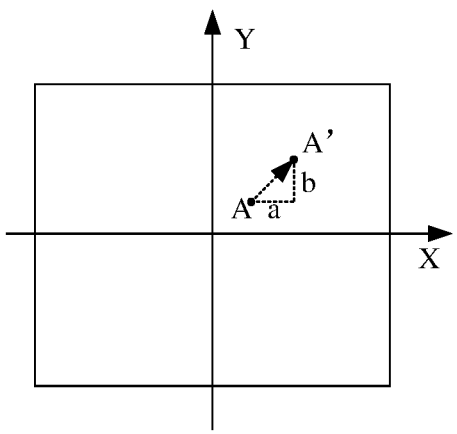
FIGS. 1A-1D illustrate schematic diagrams of overlay errors on a wafer.

Exemplary implementations will now be described more comprehensively with reference to the drawings. However, the exemplary implementations may be implemented in various forms, and should not be understood to be limited to implementations elaborated herein. Instead, these implementations are provided to make the disclosure more comprehensive and complete and comprehensively communicate the ideas of the exemplary implementations to those skilled in the art. The same reference signs in the drawings illustrate same or similar structures, so that detailed description thereof is omitted.

In the working process of an overlay device (such as a photoetching device), all fields on a semiconductor material (such as a silicon wafer) are exposed one by one, and then the semiconductor material is replaced until all the semiconductor materials are exposed. After the process treatment of the semiconductor material is finished, a mask is replaced to expose a second pattern layer on the semiconductor material, the exposure is repeated. The pattern exposed by a second mask layer must be accurately overlapped with that exposed by a first mask layer, which is hence called an overlay operation. Theoretically, the two pattern layers should be completely coincident, but in fact, due to the existence of high-order distortion, the positions of the two pattern layers are deviated, that is, an overlay deviation value appears.

FIGS. 1A-1D illustrate schematic diagrams of overlay errors on a wafer.

Referring to FIG. 1A, FIG. 1A illustrates a schematic diagram of an overlay error. The box represents a wafer fixing area. Point A represents the position of an overlay mark of a previous layer, and point A' represents the position of an overlay mark of a present layer. a and b are deviation values of point A' relative to point A on the X axis and Y axis of a coordinate system, respectively, so the overlay error value of point A' relative to point A is expressed by (a, b), which may be expressed by a vector from point A to point A' on the wafer.

Figure 1B:
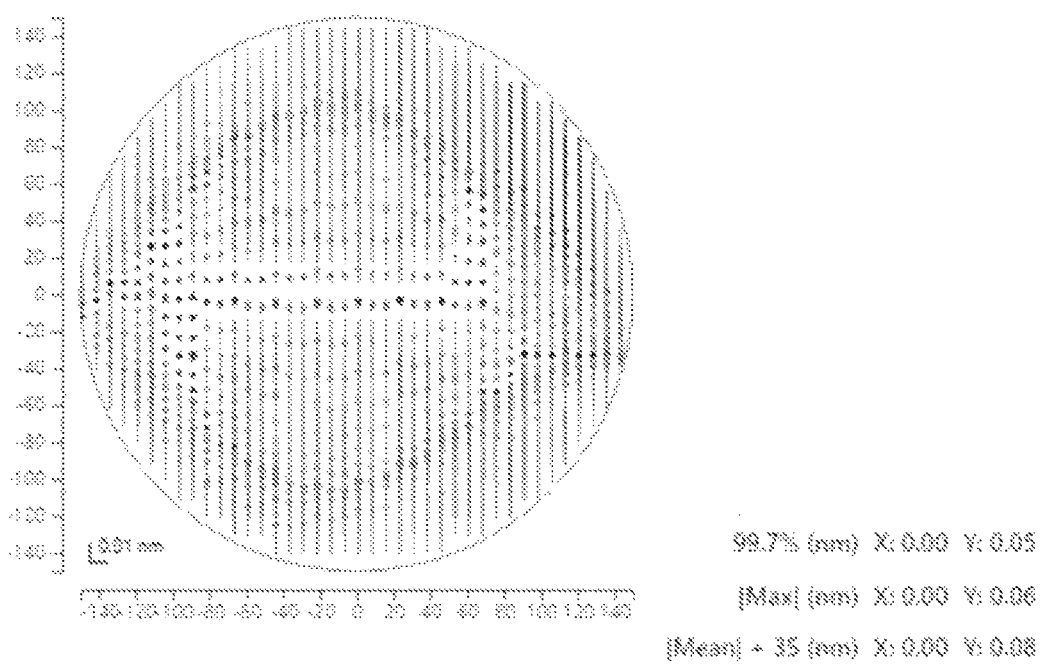

Referring to FIG. 1B, FIG. 1B illustrates a schematic diagram of a display interface of an overlay error detection result. In order to more accurately detect the process deviation at different positions of the wafer, multiple overlay marks are usually set in each layer of the wafer, so that overlay errors at different positions of the wafer may be obtained by one detection, that is, multiple vector marks in FIG. 1B. Generally speaking, a standard length is set for the overlay error of each layer (non-identical standard lengths are set for overlay errors of different layers), so as to determine that the overlay error is within a normal range when the length of the overlay error is less than (or less than or equal to) the standard length of the layer thereof.

Figure 1C:
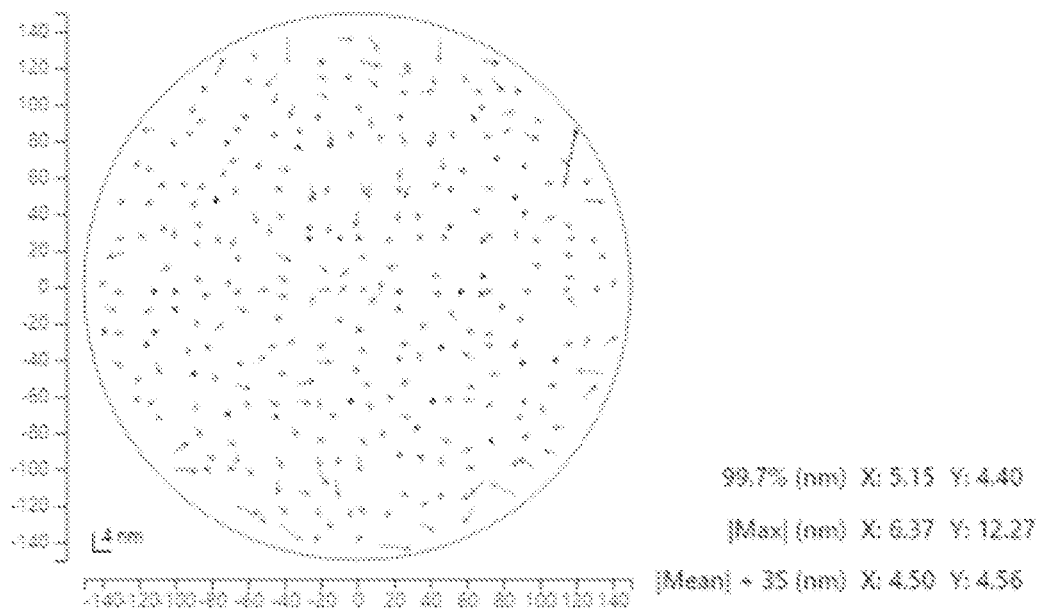

FIG. 1C illustrates a schematic diagram of a wafer detection interface where most overlay errors are within the normal range. The vectors representing the overlay errors are all short, which indicates that the overlay errors are small.

Figure 1D:
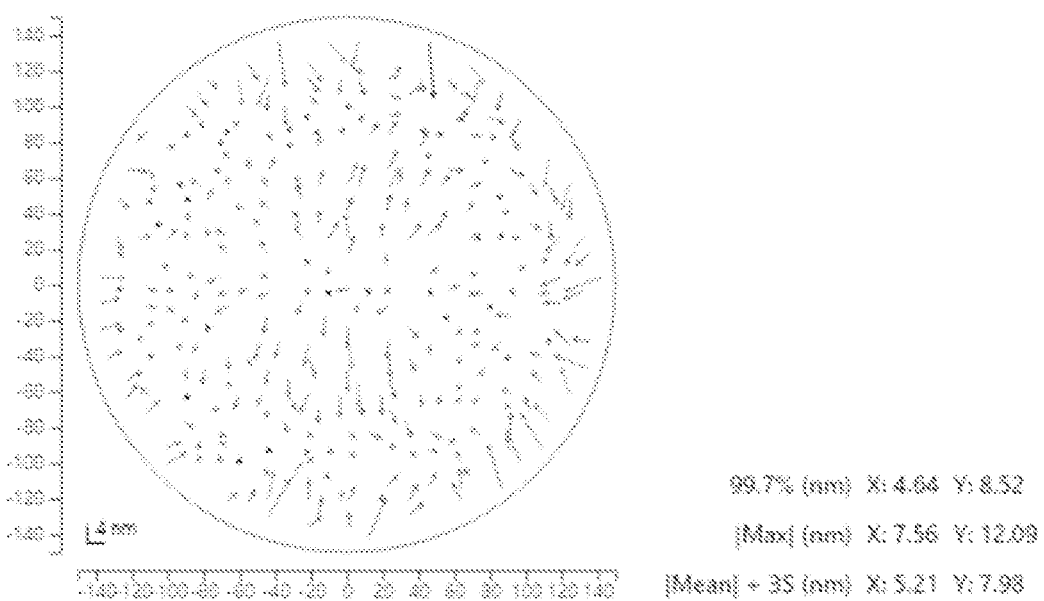

FIG. 1D illustrates a schematic diagram of a wafer detection interface where most overlay errors are abnormal. The vectors representing the overlay errors are long, which indicates that the overlay errors are large.

As described in the background art, in order to improve the overlay accuracy, an overlay compensation method is adopted in the related art to make the overlay deviation as close to zero as possible. However, with an existing compensation method, after an etching process is performed, the pattern on the wafer will be deviated, without achieving an expected effect.

During researches, inventors of the disclosure found that in the related art, the overlay deviation value is determined by the overlay mark formed in a photoresist layer on the wafer surface and the overlay mark of the previous layer. Since the overlay mark in the photoresist layer can only be used to simulate the pattern, but cannot represent a real actual pattern position, the pattern in the related art will be deviated, resulting in low overlay accuracy and affecting the product yield.

Figure 2:
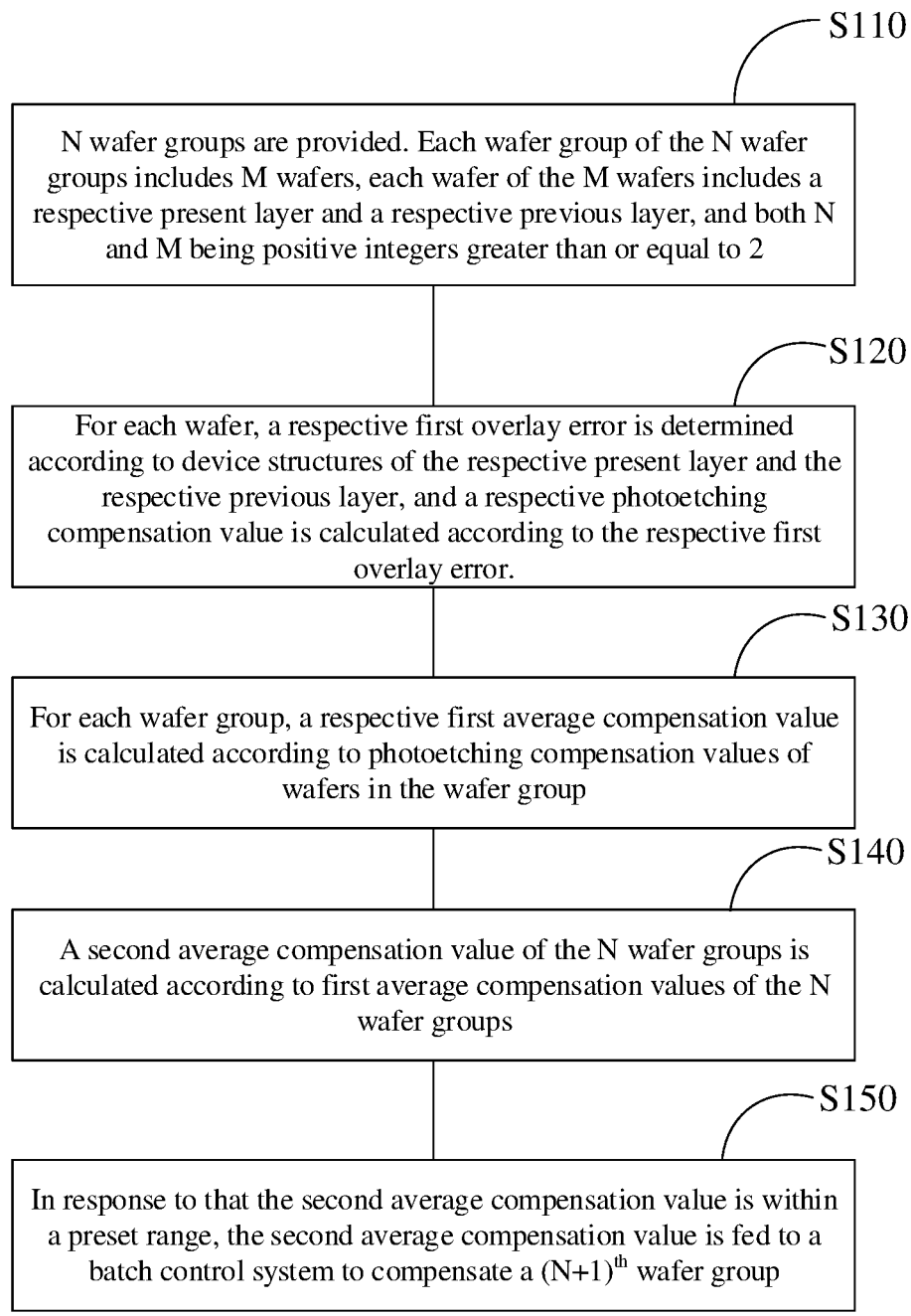
FIG. 2 illustrates a flowchart of a method for overlay error compensation according to an embodiment of the disclosure.

As illustrated in FIG. 2, FIG. 2 illustrates a flowchart of a method for overlay error compensation according to an embodiment of the disclosure. The method for overlay error compensation of the embodiment of the disclosure includes the following operations.

At S110, N wafer groups are provided. Each wafer group of the N wafer groups includes M wafers, each wafer of the M wafers includes a respective present layer and a respective previous layer, and both N and M being positive integers greater than or equal to 2.

At S120, for each wafer, a respective first overlay error is determined according to device structures of the respective present layer and the respective previous layer, and a respective photoetching compensation value is calculated according to the respective first overlay error.

At S130, for each wafer group, a respective first average compensation value is calculated according to photoetching compensation values of wafers in the wafer group.

At S140, a second average compensation value of the N wafer groups is calculated according to first average compensation values of the N wafer groups.

At S150, in response to that the second average compensation value is within a preset range, the second average compensation value is fed to a batch control system to compensate a $(N+1)^{th}$ wafer group.

According to the method for overlay error compensation of the embodiments of the disclosure, by determining the overlay error of actual device structures of the present layer and the previous layer of the wafer and calculating the compensation value according to the overlay error, the next layer of wafer is further compensated. Compared with measuring overlay marks in the related art, due to that the actual patterns of the present layer and the previous layer are measured in the compensation method of the embodiment of the disclosure, the relative position between the device structures of the present layer and the previous layer can be more truly reflected, and an accurate compensation value is finally obtained, thereby significantly improving the overlay accuracy.

At S110, N wafer groups are provided. Each wafer group of the N wafer groups includes M wafers, each wafer of the M wafers includes a respective present layer and a respective previous layer, and both N and M being positive integers greater than or equal to 2.

In this step, the N wafer groups may represent N batches of wafers. In an implementation, N may be 2, 3, 4 or another positive integer. Each batch of wafers includes M wafers. For example, M may be greater than or equal to 10 and less than or equal to 50, and the disclosure is not limited thereto.

Each of the M wafers includes a present layer and a previous layer, and both the present layer and the previous layer include a device structure. Of course, the present layer and the previous layer may also include overlay marks. It is to be understood that by measuring the offset of the pattern of the present layer relative to the pattern of the previous layer, the quality of a photoetching process can be checked, that is, whether the overlay error meets a preset value can be judged.

In specific implementation, the present layer and the previous layer may or may not be adjacent to each other. For example, when the present layer is not adjacent to the previous layer, another dielectric film layer, another conductive metal layer or the like are also deposited between the present layer and the previous layer.

At S120, for each wafer, a respective first overlay error is determined according to device structures of the respective present layer and the respective previous layer, and a respective photoetching compensation value is calculated according to the respective first overlay error.

In this step, the first overlay error of each wafer is determined by obtaining the position of the device structure of the previous layer and the position of the device structure of the present layer corresponding to the device structure of the previous layer. In this step, the relative positions between the actual device structures in the present layer and the previous layer are obtained, so that the numerical value of the first overlay error can more truly reflect the position deviation between actual patterns of the present layer and the previous layer of the wafer, and thus the determined photoetching compensation value is more accurate.

It is worth mentioning that the term "photoetching compensation value" may be understood as compensation for the photoetching/etching process of the wafer. Specifically, the "photoetching compensation value" may be decided by the control accuracy of a mask plate itself, the accuracy in movement synchronization between a mask table and a silicon wafer table, the magnification of a lens and aberration control.

The device structure of the wafer may include one or more of a transistor, a bit line, a word line and a contact structure.

For example, the device structure only includes one of a transistor, a bit line, a word line or a contact structure, and of course may include any combination of a transistor, a bit line, a word line and a contact structure.

In the embodiments of the disclosure, the determination of the first overlay error may be realized by measurement using Image Based Overlay (IBO), a scanning electron microscope (SEM) and a new In Device Metrology (IDM, also known as In Die Measurement).

In an implementation, the operation that for each wafer, the respective first overlay error is determined according to the device structures of the respective present layer and the respective previous layer includes the following operation:

An optical diffraction method is used to acquire the respective first overlay error by: acquiring first overlay errors between the device structure of the respective present layer and the device structure of the respective previous layer in an X direction and a Y direction respectively according to diffracted beam intensity distribution formed by the device structure of the respective present layer and the device structure of the respective previous layer.

Specifically, after device structures are formed in the previous layer and the present layer of the wafer respectively, measurement is performed by the optical diffraction method, and the first overlay errors between the device structure of the present layer and the device structure of the previous layer in the X direction and the Y direction respectively are obtained according to diffracted beam intensity distribution formed by the device structure of the present layer and the device structure of the previous layer.

Based on the principle of optical diffraction, the principle of performing overlay error measurement using the above overlay marks is as follows:

$$As+d=K*(OV+d);$$

$$As-d=K*(OV-d);$$

$$OV=d*[(As^{+d}+As^{-d})/(As^{+d}-As^{-d})];$$

OV represents an unknown first overlay error. As+d represents the light intensity obtained by measuring diffracted light of the device structure of the present layer and the device structure of the previous layer. As−d represents the light intensity obtained by measuring the diffracted light of the device structure of a next layer of the present layer and the device structure of the previous layer. K represents a coefficient related to the thickness. d represents an offset value.

In some embodiments, an SEM may also be used to acquire the respective first overlay error by: acquiring first overlay errors between the device structure of the respective present layer and the device structure of the respective previous layer in an X direction and a Y direction respectively according to a scanned image of the device structure of the respective present layer and a scanned image of the device structure of the respective previous layer. Namely, the overlay errors between the device structures of the present layer and the previous layer in the X direction and the Y direction respectively by directly measuring the scanned images.

At S130, for each wafer group, a respective first average compensation value is calculated according to photoetching compensation values of wafers in the wafer group.

At S140, a second average compensation value of the N wafer groups is calculated according to first average compensation values of the N wafer groups.

In S130 and S140, the first average compensation value of each wafer group is calculated according to the photoetching compensation values, and then the second average compensation value of the N wafer groups is calculated according to first average compensation values.

Specifically, if each wafer in each wafer group has a corresponding photoetching compensation value, the first average compensation value of the wafer group=(the photoetching compensation value of a first wafer+the photoetching compensation value of a second wafer+ . . . the photoetching compensation value of an $M^{th}$ wafer)/M. Similarly, if each of the N wafer groups has a first average compensation value, the second average compensation value=(the first average compensation value of a first wafer group+the first average compensation value of a second wafer group+ . . . the first average compensation value of a $N^{th}$ wafer group)/N.

By obtaining an averaged compensation value, the influence caused by extreme values is avoided, so that the wafer can be optimally compensated, and thus the overlay accuracy can meet the requirements.

At S150, in response to that the second average compensation value is within a preset range, the second average compensation value is fed to a batch control system to compensate a $(N+1)^{th}$ wafer group.

In this step, when the second average compensation value is within the preset range, the batch control system can compensate the photoetching/etching process of the $(N+1)^{th}$ wafer group according to the second average compensation value, so as to implement compensation in advance. In addition, by judging whether the second average compensation value exceeds the preset range, the influence caused by the extreme values can be avoided and the compensation accuracy can be improved.

Specifically, as described above, the second average compensation value=(the first average compensation value of a first wafer group+the first average compensation value of a second wafer group+ . . . the first average compensation value of a Nth wafer group)/N. Then the numerical value of the photoetching compensation value of each wafer in each wafer group will affect the final second average compensation value. If wafer processing is compensated directly according to the second average compensation value regardless of whether the second average compensation value is within the preset range, the situation that the second average compensation value is large or small may occur due to a certain abnormal wafer or some abnormal wafers, resulting in that the obtained second average compensation value is not the compensation value required by most wafers, and finally reducing the compensation accuracy.

Figure 3:
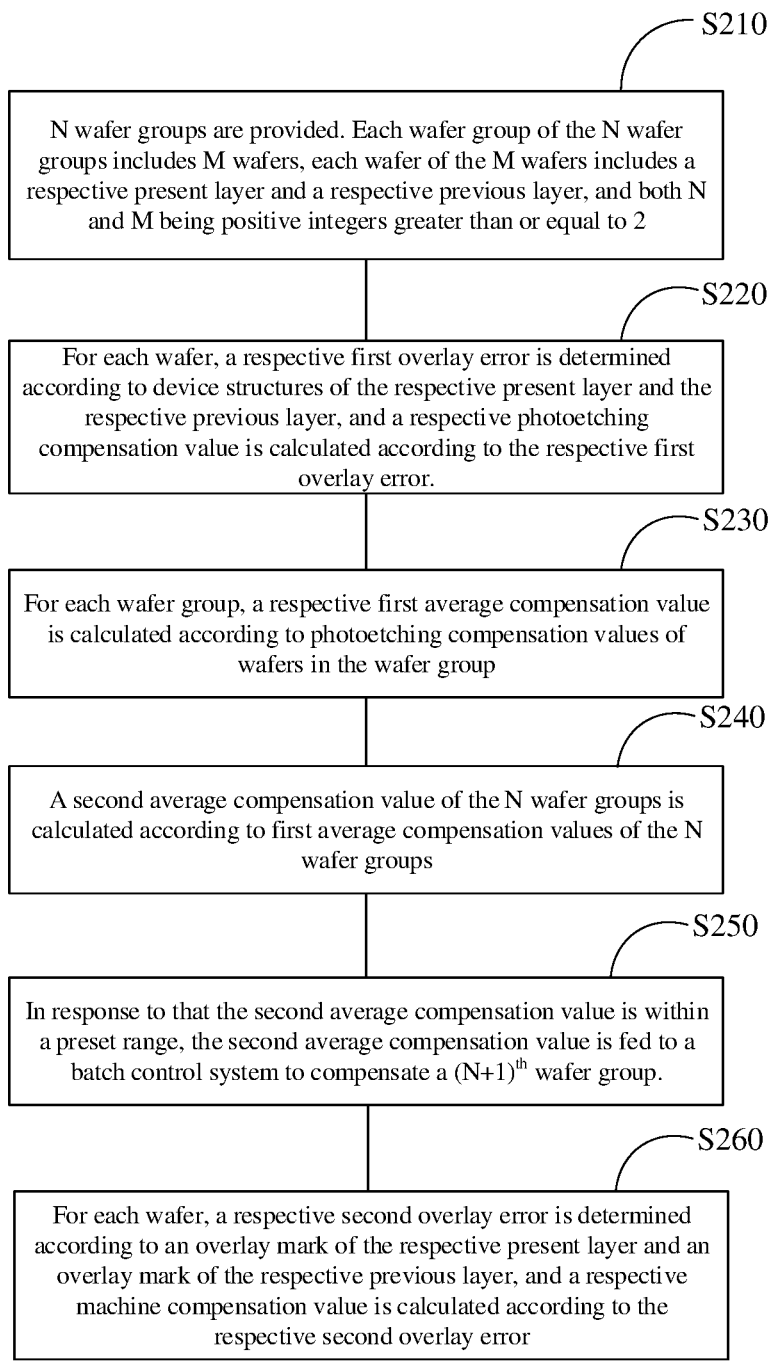
FIG. 3 illustrates a flowchart of a method for overlay error compensation according to another embodiment of the disclosure.

As illustrated in FIG. 3, FIG. 3 illustrates a flowchart of a method for overlay error compensation according to another embodiment of the disclosure.

In the embodiments of the disclosure, the method for overlay error compensation further includes that: at S260, for each wafer, a respective second overlay error is determined according to an overlay mark of the respective present layer and an overlay mark of the respective previous layer, and a respective machine compensation value is calculated according to the respective second overlay error.

In S260, the machine compensation value of each wafer may be obtained through the second overlay error determined by the overlay marks of the present layer and the previous layer. According to the machine compensation value, a lithography machine may be compensated so as to improve the overlay accuracy of the wafer.

It is to be understood that steps S210 to S250 may be the same as steps S110 to S150 of the above embodiments, which will not be elaborated here.

It is to be noted that the obtained machine compensation value is to compensate the error of the machine itself. After the machine is compensated once or twice according to the machine compensation value, the error of the machine itself has been corrected, and there is no need to continue to obtain the second overlay error any more.

In one implementation, the operation that for each wafer, the respective second overlay error is determined according to the overlay mark of the respective present layer and the overlay mark of the respective previous layer includes the following operations:

a light wave reflection method is used to acquire the respective second overlay error by: acquiring second overlay errors between the overlay mark of the respective present layer and the overlay mark of the respective previous layer in an X direction and a Y direction respectively according to an image formed by reflection of the overlay mark of the respective present layer and an image formed by reflection of the overlay mark of the respective previous layer.

It is to be understood that the overlay mark may include an Advanced Imaging Metrology (AIM) structure composed of periodic materials, a Bar-in-bar structure composed of single-line structures, a combination of block structures (Box-in-box), frame-in-frame structure or any other structure that can correctly identify edge features based on an optical method and can calculate interlayer overlay. Considering the minimum resolution requirement of visible light or near infrared optics which is most commonly used at present, the dimension of the overlay mark is not limited to an existing fixed period and dimension. The minimum line cycle may be reduced to 1 micron, the minimum line width may be reduced to 500 nanometers, and the dimension of the whole overlay mark area may be 10 microns or more.

In an exemplary implementation, the operation that for each wafer, the respective photoetching compensation value is calculated according to the respective first overlay error includes that: the respective photoetching compensation value is determined by None Zero Offset (NZO) and/or Correction Per Exposure (CPE). The operation that for each wafer, the respective machine compensation value is calculated according to the respective second overlay error includes that: the respective photoetching compensation value, a machine compensation value, a first average compensation value and a second average compensation value are determined by NZO and/or CPE.

It is to be understood that NZO refers to the compensation of the whole wafer, while CPE refers to the compensation of a partial area of the wafer.

It is to be noted that each of the photoetching compensation value, the machine compensation value, the first average compensation value and the second average compensation value in the embodiment of the disclosure includes one or more of: X-direction translation, Y-direction translation, a wafer rotation parameter, a wafer non-orthogonality parameter, wafer X-direction extension, wafer Y-direction extension, an exposure area rotation parameter, an exposure area magnification, an exposure area asymmetric rotation parameter, and an exposure area asymmetric magnification.

Specifically, the compensation value includes grid parameters of translation (Tx, Ty) in the X/Y direction, silicon wafer rotation (Rx, Ry) in the X/Y direction and grid amplification (Mx, My) in the X/Y direction. Exposure area parameters are mask rotation (R'x, R'y) in the X/Y direction and mask magnification (M'x, M'y) in the X/Y direction.

Description is made below by taking the compensation value including the grid parameters of the translation (Tx, Ty) in the X/Y direction as an example.

The position of the overlay mark may be expressed by the coordinates of the overlay mark on a two-dimensional horizontal plane. Correspondingly, the first overlay error between the present layer and the previous layer may be expressed by a vector on the two-dimensional horizontal plane. For example, assuming that one overlay mark position of the present layer is (x1, y1) and the corresponding overlay mark position of the previous layer is (x2, y2), the first overlay deviation value of the present layer at the position (x1, y1) relative to the previous layer at the corresponding position is (x1-x2, y1-y2).

Similarly, the second overlay error may also be expressed by the translation (Tx, Ty) parameter in the X/Y direction, which will not be elaborated here.

The method for overlay error compensation of the embodiments of the disclosure further includes that: the batch control system acquires machine compensation values of different models according to the respective second overlay error, and compensates each wafer group according to a machine model corresponding to the wafer group.

Generally, one wafer or a group of wafers need to be processed by multiple machines of different models. In the embodiment, the machine compensation values of different models are acquired according to the second overlay error, so that the batch control system can perform corresponding compensation according to the machine model corresponding to the wafer group, that is, the machine compensation values of different models may be combined to compensate the wafer.

Specifically, different machine compensation values corresponding to multiple machines A, B, C and D of different models are A1, B1, C1 and D1, respectively. If a wafer needs to be processed by machines A, B and C, A1, B1 and C1 are directly called. If a wafer needs to be processed by machines B, C and D, B1, C1 and D1 are directly called.

It is to be understood that the machines of different models include, but are not limited to an I-line lithography machine, a KrF lithography machine, an ArF lithography machine, an extreme ultraviolet (EUV) lithography machine, an electron beam lithography machine, etc.

The method for overlay error compensation of the embodiments of the disclosure further includes that a next wafer group of the present wafer group is compensated according to the first average compensation value of the present wafer group.

Specifically, as described above, if the first average compensation value=(the photoetching compensation value of a first wafer+the photoetching compensation value of a second wafer+ . . . the photoetching compensation value of an $M^{th}$ wafer)/M, the first average compensation value is the compensation value of one wafer group of the N wafer groups, and a next wafer group of the one wafer group may be compensated according to the first average compensation value.

Figure 4:
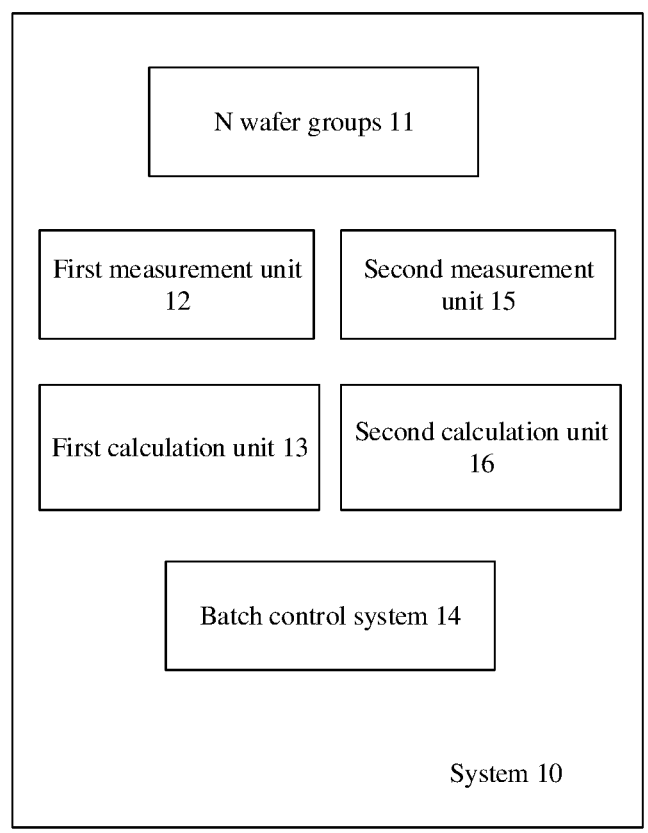
FIG. 4 illustrates a schematic diagram of a system for overlay error compensation according to an embodiment of the disclosure.

As illustrated in FIG. 4, FIG. 4 illustrates a schematic diagram of a system for overlay error compensation according to an embodiment of the disclosure. According to another aspect of the embodiment of the disclosure, a system for overlay error compensation is further provided. The system 10 includes N wafer groups 11, a first measurement unit 12, a first calculation unit 13 and a batch control system 14. Each wafer group of the N wafer groups includes M wafers, each wafer of the M wafers includes a present layer and a previous layer, and both N and M are positive integers greater than or equal to 2. The first measurement unit 12 is configured to: for each wafer, determine a respective first overlay error according to device structures of the respective present layer and the respective previous layer. The first calculation unit 13 is configured to: calculate, for each wafer, a respective photoetching compensation value according to the respective first overlay error, calculate, for each wafer group, a respective first average compensation value according to photoetching compensation values of wafers in the wafer group, and calculate a second average compensation value of the N wafer groups according to first average compensation values of the N wafer groups. The batch control system 14 is configured to: compensate a $(N+1)^{th}$ wafer group in response to that the second average compensation value is within a preset range.

In one implementation, the first measurement unit 12 acquires the respective first overlay error using an optical diffraction method.

In one implementation, the first measurement unit 12 acquires the respective first overlay error using a scanning electron microscope (SEM).

The system for overlay error compensation of the embodiment of the disclosure further includes a second measurement unit 15 and a second calculation unit 16.

The second measurement unit 15 is configured to determine, for each wafer, a respective second overlay error according to an overlay mark of the respective present layer and an overlay mark of the respective previous layer. The second calculation unit 16 is configured to calculate a respective machine compensation value according to the respective second overlay error.

In one implementation, the second measurement unit 15 acquires the respective second overlay error using a light wave diffraction method.

In one implementation, the first calculation unit 13 the respective photoetching compensation value by None Zero Offset (NZO) and/or Correction Per Exposure (CPE). The second calculation unit 16 determines the respective machine compensation value by NZO and/or CPE.

In one implementation, the batch control system 14 determines machine compensation values of different models according to the respective second overlay error.

According to yet another aspect of the disclosure, further provided is a computer-readable storage medium having stored thereon a computer program that, when executed by a processor, causes the processor to implement the steps of the method as described in any of the above.

The computer readable storage medium of the embodiment of the disclosure stores thereon a program product capable of implementing the above method of the specification. In some possible implementations, various aspects of the disclosure may also be implemented in the form of a program product including a program code for causing a terminal device to perform the steps according to various exemplary implementations of the disclosure described in the above method section of the specification when the program product is running on the terminal device.

The program product of the disclosure may be a portable Compact Disk Read Only Memory (CD-ROM) and include a program code, and may run on a terminal device, such as a personal computer. However, the program product of the disclosure is not limited thereto. In the disclosure, the readable storage medium may be any physical medium including or storing a program, and the program may be used by or in combination with an instruction execution system, device, or apparatus.

The program product may be any combination of one or more readable mediums. The readable medium may be a readable signal medium or a readable storage medium. The readable storage medium may be, but not limited to, for example, an electrical, magnetic, optical, electromagnetic, infrared, or semiconductor system, device, or apparatus, or any combination thereof. More specific examples (a non-exhaustive list) of the readable storage medium may include an electrical connector with one or more wires, a portable disk, a hard disk, a Random Access Memory (RAM), a Read-Only Memory (ROM), an Erasable Programmable ROM (EPROM or a flash memory), an optical fiber, a CD-ROM, an optical storage device, a magnetic storage device, or any proper combination thereof.

The computer readable signal medium may include a data signal in a baseband or propagating as part of a carrier, a readable program code being born therein. Multiple forms may be adopted for the propagating data signal, including, but not limited to, an electromagnetic signal, an optical signal, or any proper combination. The readable signal medium may also be any readable medium except the readable storage medium, and the readable medium may send, propagate, or transmit a program configured to be used by or in combination with an instruction execution system, device, or apparatus.

The program code in the readable medium may be transmitted with any proper medium, including, but not limited to, radio, a wire, an optical cable, Radio Frequency (RF), etc. or any proper combination thereof.

The program code for executing the operations of the disclosure may be written in any combination of one or more programming languages, including object-oriented programming languages such as Java and C++, and conventional procedural programming languages such as "C" language or similar programming languages. The program code may be executed completely on a user computing device, partially on a user device, as a separate software package, partially on a user computing device, partially on a remote computing device, or completely on a remote computing device or server. In the case of the remote computing device, the remote computing device may be connected to a user computing device through any kind of network, including a local area network (LAN) or a wide area network (WAN), or may be connected to an external computing device (such as through the Internet using an Internet service provider).

According to the method and system for overlay error compensation of the embodiments of the disclosure, the overlay error of actual device structures of the present layer and the previous layer of the wafer is determined, and the compensation value is calculated according to the overlay error, so that the next layer of wafer is compensated. Compared with measurement of overlay marks in a related art, the method for compensation of the embodiments of the disclosure is more accurate in compensation, and the overlay accuracy is significantly improved.

It is to be noted that although several modules or units of the device for action execution are mentioned in the above detailed description, the division is not mandatory. Actually, according to the implementations of the disclosure, the features and functions of two or more modules or units described above may be embodied in one module or unit. On the contrary, the features and functions of one module or unit described above may be further embodied and divided into multiple modules or units.

In addition, various steps of the method in the disclosure are described in the accompanying drawings in specific sequence. However, this does not require or imply that these steps must be executed in the specific sequence, or that all the steps illustrated must be executed to achieve desired results. Additionally or alternatively, certain steps may be omitted, multiple steps are combined into one step for executing, and/or one step is decomposed into multiple steps for executing, and the like.

Through the above descriptions about the implementations, it is easily understood by those skilled in the art that the exemplary implementations described here may be implemented by software, or may be implemented by combining software and necessary hardware. Therefore, the technical solution of the implementations of the disclosure may be embodied in the form of a software product. The software product may be stored in a nonvolatile storage medium (such as a CD-ROM, a USB flash drive, and a mobile hard disc drive) or in a network, and includes several instructions to make a computing device (which may be a personal computer, a server, a mobile terminal, or a network device, etc.) to execute the method described in various implementations of the disclosure.

In the embodiments of the disclosure, terms "first", "second" and "third" are only used for describing purposes, and cannot be understood as indicating or implying relative importance. Term "a plurality of" refers to two or more than two, unless otherwise explicitly defined. Terms "mounting", "mutual connection", "connection", and "fixing" should be generally understood. For example, "connection" may be fixed connection, or detachable connection, or integral connection. "Mutual connection" may be direct connection, or indirect connection through an intermediate medium. Those of ordinary skill in the art may understand the specific meanings of the terms in the embodiments of the disclosure according to specific conditions.

In the descriptions of the embodiments of the disclosure, it is to be understood that the orientation or location relationships indicated by terms "upper", "lower", "left", "right", "front" and "rear" are orientation or location relationships illustrated on the basis of the drawings, which are only for the convenience of describing the embodiments of the disclosure and simplifying the descriptions, rather than indicating or implying that the referred apparatuses or elements must have a specific orientation, and be constructed and operated in the specific orientation. Therefore, it cannot be understood as a limitation to the embodiments of the disclosure.

In the description of the specification, the description of terms "one embodiment", "some embodiments", "specific embodiments" and so on means that the specific features, structures, materials or characteristics described in combination with the embodiment or example are included in at least one embodiment or example of the embodiments of the disclosure. In this specification, the schematic expressions of the above terms do not necessarily refer to the same embodiments or examples. Furthermore, the described specific features, structures, materials or characteristics may be combined in any suitable manner in one or more embodiments or examples.

The above is only the preferred embodiments of the embodiments of the disclosure and is not used to limit the embodiments of the disclosure. For those skilled in the art, there may be various changes and variations in the embodiments of the disclosure. Any modifications, equivalent replacements, improvements and the like made within the spirit and principle of the embodiments of the disclosure shall fall within the scope of protection of the embodiments of the disclosure.

The invention claimed is:

1. A method for overlay error compensation, comprising:
providing N wafer groups, wherein each wafer group of the N wafer groups comprises M wafers, each wafer of the M wafers comprises a respective present layer and a respective previous layer, and both N and M are positive integers greater than or equal to 2;
for each wafer, determining a respective first overlay error according to device structures of the respective present layer and the respective previous layer, and calculating a respective photoetching compensation value according to the respective first overlay error;
for each wafer group, calculating a respective first average compensation value according to photoetching compensation values of wafers in the wafer group;
calculating a second average compensation value of the N wafer groups according to first average compensation values of the N wafer groups; and
in response to that the second average compensation value is within a preset range, feeding the second average compensation value to a batch control system to compensate a $(N+1)^{th}$ wafer group.

2. The method for overlay error compensation of claim 1, wherein each of the device structures comprises at least one of:
a transistor,
a bit line,
a word line, or
a contact structure.

3. The method for overlay error compensation of claim 1, wherein for each wafer, determining the respective first overlay error according to the device structures of the respective present layer and the respective previous layer comprises:
using an optical diffraction method to acquire the respective first overlay error by: acquiring first overlay errors between the device structure of the respective present layer and the device structure of the respective previous layer in an X direction and a Y direction respectively according to diffracted beam intensity distribution formed by the device structure of the respective present layer and the device structure of the respective previous layer.

4. The method for overlay error compensation of claim 1, wherein for each wafer, determining the respective first overlay error according to the device structures of the respective present layer and the respective previous layer comprises:
using a scanning electron microscope (SEM) to acquire the respective first overlay error by: acquiring first overlay errors between the device structure of the respective present layer and the device structure of the respective previous layer in an X direction and a Y direction respectively according to a scanned image of the device structure of the respective present layer and a scanned image of the device structure of the respective previous layer.

5. The method for overlay error compensation of claim 1, further comprising:
for each wafer, determining a respective second overlay error according to an overlay mark of the respective present layer and an overlay mark of the respective previous layer, and calculating a respective machine compensation value according to the respective second overlay error.

6. The method for overlay error compensation of claim 5, wherein for each wafer, determining the respective second overlay error according to the overlay mark of the respective present layer and the overlay mark of the respective previous layer comprises:
using a light wave reflection method to acquire the respective second overlay error by: acquiring second overlay errors between the overlay mark of the respective present layer and the overlay mark of the respective previous layer in an X direction and a Y direction respectively according to an image formed by reflection of the overlay mark of the respective present layer and an image formed by reflection of the overlay mark of the respective previous layer.

7. The method for overlay error compensation of claim 6, wherein for each wafer, calculating the respective photo-etching compensation value according to the respective first overlay error comprises:
determining the respective photoetching compensation value by at least one of none-zero offset (NZO) or correction per exposure (CPE), and
wherein for each wafer, calculating the respective machine compensation value according to the respective second overlay error comprises:
determining the respective machine compensation value by at least one of NZO or CPE.

8. The method for overlay error compensation of claim 7, wherein each of the photoetching compensation value, the machine compensation value, the first average compensation value and the second average compensation value comprises at least one of:
X-direction translation, Y-direction translation, a wafer rotation parameter, a wafer non-orthogonality parameter, wafer X-direction extension, wafer Y-direction extension, an exposure area rotation parameter, an exposure area magnification, an exposure area asymmetric rotation parameter, or an exposure area asymmetric magnification.

9. The method for overlay error compensation of claim 5, further comprising:
acquiring machine compensation values of different models according to the respective second overlay error, and compensating each wafer group according to a machine model corresponding to the wafer group.

10. The method for overlay error compensation of claim 1, further comprising:
compensating a next wafer group of a present wafer group according to the first average compensation value of the present wafer group.

11. A system for overlay error compensation, comprising:
N wafer groups, wherein each wafer group of the N wafer groups comprises M wafers, each wafer of the M wafers comprises a respective present layer and a respective previous layer, and both N and M are positive integers greater than or equal to 2;
a first measurement component, configured to: for each wafer, determine a respective first overlay error according to device structures of the respective present layer and the respective previous layer;
a first calculation unit, configured to: calculate, for each wafer, a respective photoetching compensation value according to the respective first overlay error, calculate, for each wafer group, a respective first average compensation value according to photoetching compensation values of wafers in the wafer group, and calculate a second average compensation value of the N wafer groups according to first average compensation values of the N wafer groups; and
a batch control system, configured to compensate a (N+1)th wafer group in response to that the second average compensation value is within a preset range.

12. The system for overlay error compensation of claim 11, wherein the first measurement component acquires the respective first overlay error using an optical diffraction method.

13. The system for overlay error compensation of claim 11, wherein the first measurement component acquires the respective first overlay error using a scanning electron microscope (SEM).

14. The system for overlay error compensation of claim 11, further comprising a second measurement component and a second calculation unit,
wherein the second measurement component is configured to determine, for each wafer, a respective second overlay error according to an overlay mark of the respective present layer and an overlay mark of the respective previous layer, and
the second calculation unit is configured to calculate a respective machine compensation value according to the respective second overlay error.

15. The system for overlay error compensation of claim 14, wherein the second measurement component acquires the respective second overlay error using a light wave reflection method.

16. The system for overlay error compensation of claim 15, wherein the first calculation unit determines the respective photoetching compensation value by at least one of none zero offset (NZO) or correction per exposure (CPE), and the second calculation unit determines the respective machine compensation value by at least one of NZO or CPE.

17. The system for overlay error compensation of claim 16, wherein each of the photoetching compensation value, the machine compensation value, the first average compensation value and the second average compensation value comprises at least one of:
X-direction translation, Y-direction translation, a wafer rotation parameter, a wafer non-orthogonality parameter, wafer X-direction extension, wafer Y-direction extension, an exposure area rotation parameter, an exposure area magnification, an exposure area asymmetric rotation parameter, or an exposure area asymmetric magnification.

18. The system for overlay error compensation of claim 14, wherein the batch control system acquires machine compensation values of different models according to the respective second overlay error, and compensates each wafer group according to a machine model corresponding to the wafer group.

19. The system for overlay error compensation of claim 11, wherein the batch control system compensates a next wafer group of a present wafer group according to the first average compensation value of the present wafer group.

20. A non-transitory computer-readable storage medium having stored thereon a computer program that, when being executed by a processor, causes the processor to:
provide N wafer groups, wherein each wafer group of the N wafer groups comprises M wafers, each wafer of the M wafers comprises a respective present layer and a respective previous layer, and both N and M are positive integers greater than or equal to 2;

for each wafer, determine a respective first overlay error according to device structures of the respective present layer and the respective previous layer, and calculate a respective photoetching compensation value according to the respective first overlay error;

for each wafer group, calculate a respective first average compensation value according to photoetching compensation values of wafers in the wafer group;

calculate a second average compensation value of the N wafer groups according to first average compensation values of the N wafer groups; and in response to that the second average compensation value is within a preset range, feed the second average compensation value to a batch control system to compensate a $(N+1)^{th}$ wafer group.

* * * * *